(12) United States Patent
Feng et al.

(10) Patent No.: US 11,069,272 B2
(45) Date of Patent: Jul. 20, 2021

(54) SHIFT REGISTER, GATE DRIVE CIRCUIT, DISPLAY PANEL, AND DRIVING METHOD

(71) Applicants: Hefei BOE Optoelectronics Technology Co., Ltd., Hefei (CN); BOE Technology Group Co., Ltd., Beijing (CN)

(72) Inventors: Silin Feng, Beijing (CN); Zhifu Dong, Beijing (CN); Wei Xue, Beijing (CN); Hongmin Li, Beijing (CN)

(73) Assignees: Hefei BOE Optoelectronics Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 181 days.

(21) Appl. No.: 16/339,554

(22) PCT Filed: Aug. 29, 2018

(86) PCT No.: PCT/CN2018/102937
§ 371 (c)(1),
(2) Date: Apr. 4, 2019

(87) PCT Pub. No.: WO2019/042314
PCT Pub. Date: Mar. 7, 2019

(65) Prior Publication Data
US 2020/0043393 A1 Feb. 6, 2020

(30) Foreign Application Priority Data
Aug. 29, 2017 (CN) .......................... 201710755253.3

(51) Int. Cl.
*G09G 3/20* (2006.01)
*G11C 19/28* (2006.01)

(52) U.S. Cl.
CPC ............... *G09G 3/20* (2013.01); *G11C 19/28* (2013.01); *G09G 2310/0286* (2013.01)

(58) Field of Classification Search
CPC ............ G09G 3/20; G09G 2310/0286; G09G 2310/08; G09G 2300/0408; G11C 19/28
See application file for complete search history.

(56) References Cited

U.S. PATENT DOCUMENTS 9,459,730 B2  10/2016  Long et al.
9,886,889 B2   2/2018  Hao et al.
(Continued)

FOREIGN PATENT DOCUMENTS

CN   103680636 A    3/2014
CN   103996370 A    8/2014
CN   104167192 A   11/2014

OTHER PUBLICATIONS

Nov. 19, 2018—(WO) International Search Report and Written Opinion Appn PCT/CN2018/102937 with English Translation.
Apr. 9, 2021—EP Partial European Search Report Appn 18850721.4.

*Primary Examiner* — Abhishek Sarma
(74) *Attorney, Agent, or Firm* — Banner & Witcoff, Ltd.

(57) ABSTRACT

A shift register, a gate drive circuit, a display panel, and a driving method. The shift register includes: an input circuit, which is connected to a pull-up node and an input signal terminal respectively; an output circuit, which is connected to the pull-up node, a clock signal terminal, a direct current signal terminal and an input terminal respectively, wherein the clock signal terminal provides a clock signal, the direct current signal terminal provides a direct current signal, and the output circuit outputs a scanning signal from the output terminal; and an output pull-down circuit, which is connected to the output circuit. The output circuit is configured to output a scanning signal from the output terminal as one (Continued)

from among the direct current signal and the clock signal when a first output condition is satisfied.

20 Claims, 11 Drawing Sheets

(56) References Cited

U.S. PATENT DOCUMENTS

2011/0241730 A1  10/2011  Yamamoto et al.
2016/0027371 A1* 1/2016  Hao ..................... G09G 3/2092
                                                            345/214
2016/0358566 A1* 12/2016 Li ......................... G09G 3/3677

* cited by examiner

SHIFT REGISTER, GATE DRIVE CIRCUIT, DISPLAY PANEL, AND DRIVING METHOD

The application is a U.S. National Phase Entry of International Application No. PCT/CN2018/102937 filed on Aug. 29, 2018, designating the United States of America and claiming priority to Chinese Patent Application No. 201710755253.3, filed on Aug. 29, 2017. The present application claims priority to and the benefit of the above-identified applications and the above-identified applications are incorporated by reference herein in their entirety.

TECHNICAL FIELD

Embodiments of the present disclosure relate to a shift register, a gate drive circuit, a display panel and a driving method.

BACKGROUND

With a rapid development of the display technology, display panels are increasingly moving toward high integration and low cost. A gate-driver on array (GOA) technology directly integrates a gate drive circuit on an array substrate of a display device by a photolithography process. A GOA circuit generally includes a plurality of cascaded shift registers, and each of the shift registers corresponds to a row of gate lines (for example, each shift register provides a scan driving signal to a row of gate lines) to implement scan driving of the display panel. Such integration technology can save the space of a bonding region of a gate integrated circuit (IC) and the space of a fan-out region of the gate integrated circuit, thereby achieving a narrow bezel of the display panel, and further reducing product cost and improving product yield.

SUMMARY

An embodiment of the present disclosure provides a shift register, comprising: an input circuit, respectively connected with a pull-up node and an input signal terminal; an output circuit, respectively connected with the pull-up node, a clock signal terminal, a direct-current signal terminal and an output terminal, wherein the clock signal terminal provides a clock signal, the direct-current signal terminal provides a direct-current signal, and the output circuit outputs a scanning signal through the output terminal; and an output pull-down circuit, connected with the output circuit. The output circuit is configured, in a case where a first output condition is satisfied, to output the scanning signal through the output terminal, and the scanning signal is one of the direct-current signal and the clock signal; and the output pull-down circuit is configured, in a case where a second output condition is satisfied, to pull down the scanning signal.

For example, the output circuit comprises a storage capacitor, a first output transistor and a second output transistor.

For example, the output circuit is configured, in a case where the first output condition is satisfied, to output the direct-current signal, which is from the direct-current signal terminal, through the output terminal; a first electrode of the first output transistor is connected with the clock signal terminal, a control electrode of the first output transistor is connected with the pull-up node, a second electrode of the first output transistor is connected with a control electrode of the second output transistor, a first terminal of the storage capacitor is connected with the pull-up node, and a second terminal of the storage capacitor is connected with the second electrode of first output transistor; a first electrode of the second output transistor is connected with the direct-current signal terminal, and a second electrode of the second output transistor is connected with output terminal; and when the second output transistor is turned on, the first output condition is satisfied.

For example, the shift register further comprises a pull-down control circuit, wherein the pull-down control circuit comprises a first control transistor, a second control transistor, a third control transistor and a fourth control transistor; a first electrode of the first control transistor is configured to be connected with a second voltage terminal, and a second electrode of the first control transistor is connected with a pull-down node; a first electrode of the second control transistor is connected with the pull-down node, a control electrode of the second control transistor is connected with the pull-up node, and a second electrode of the second control transistor is configured to be connected with a first voltage terminal; a first electrode of the third control transistor is configured to be connected with the second voltage terminal, a control electrode of the third control transistor is configured to be connected with the second voltage terminal, and a second electrode of the third control transistor is connected with a control electrode of the first control transistor; and a first electrode of the fourth control transistor is connected with the second electrode of the third control transistor, a control electrode of the fourth control transistor is connected with the pull-up node, and a second electrode of the fourth control transistor is configured to be connected with the first voltage terminal.

For example, the output circuit is configured, in a case where the first output condition is satisfied, to output the clock signal, which is from the clock signal terminal, through the output terminal; a first electrode of the first output transistor is connected with the direct-current signal terminal, a control electrode of the first output transistor is connected with the pull-up node, a second electrode of the first output transistor is connected with a control electrode of the second output transistor, a first terminal of the storage capacitor is connected with the pull-up node, and a second terminal of the storage capacitor is connected with the second electrode of the first output transistor; a first electrode of the second output transistor is connected with the clock signal terminal, and a second electrode of the second output transistor is connected with the output terminal; and when the second output transistor is turned on, the first output condition is satisfied.

For example, the shift register further comprises a pull-down control circuit, wherein the pull-down control circuit comprises a first control transistor and a second control transistor; a first electrode of the first control transistor is configured to be connected with a second voltage terminal, a control electrode of the first control transistor is configured to be connected with the second voltage terminal, and a second electrode of the first control transistor is connected with a pull-down node; and a first electrode of the second control transistor is connected with the pull-down node, a second electrode of the second control transistor is configured to be connected with a first voltage terminal, and a control electrode of the second control transistor is connected with the pull-up node.

For example, the output pull-down circuit comprises a first output pull-down transistor and a second output pull-down transistor; a first electrode of the first output pull-down transistor is connected with a second electrode of a first output transistor, a control electrode of the first output pull-down transistor is connected with a pull-down node, and a second electrode of the first output pull-down transistor is configured to be connected with a first voltage terminal; and a first electrode of the second output pull-down transistor is connected with the output terminal, a control electrode of the second output pull-down transistor is connected with the pull-down node, and a second electrode of the second output pull-down transistor is configured to be connected with the first voltage terminal.

For example, when the second output pull-down transistor is turned on, the second output condition is satisfied.

For example, the shift register further comprises a reset circuit, and the reset circuit is connected with the pull-up node, a reset signal terminal and a third voltage terminal; and the reset circuit is configured to receive a third voltage signal from the third voltage terminal so as to reset the output circuit, in a case where a reset condition is satisfied.

For example, the reset circuit comprises a reset transistor; and a control electrode of the reset transistor is connected with the reset signal terminal, a first electrode of the reset transistor is connected with the pull-up node, and a second electrode of the reset transistor is connected with the third voltage terminal.

For example, the shift register further comprises a pull-down hold circuit, and the pull-down hold circuit is configured to pull down a potential of the pull-up node in a case where a pull-down condition of the pull-up node is satisfied.

For example, the pull-down hold circuit comprises a pull-down hold transistor; and a control electrode of the pull-down hold transistor is connected with a pull-down node, a first electrode of the pull-down hold transistor is connected with the pull-up node, and a second electrode of the pull-down hold transistor is configured to be connected with a first voltage terminal.

An embodiment of the present disclosure provides a gate drive circuit, comprising a plurality of cascaded shift registers each of which is provided by any embodiment of the present disclosure. Except a first-stage shift register and a last-stage shift register, an input signal terminal of a shift register of present stage is connected with an output terminal of a shift register of a preceding stage; and a reset signal terminal of the shift register of present stage is connected with an output terminal of a shift register of a next stage.

An embodiment of the present disclosure provides a display panel, comprising the gate drive circuit provided by any embodiment of the present disclosure.

An embodiment of the present disclosure provides a driving method of the shift register provided by any embodiment of the present disclosure, comprising: in an input stage, setting a reset signal inputted by a reset signal terminal to be an invalid signal, setting the clock signal inputted by the clock signal terminal to be the invalid signal, and setting an input signal inputted by the input signal terminal to be a valid signal so as to pull up a potential of the pull-up node; in an output stage, setting the input signal to be the invalid signal, setting the reset signal to be the invalid signal, setting the clock signal to be the valid signal so as to output the scanning signal through the output terminal, wherein the scanning signal is one of the direct-current signal and the clock signal; in a reset stage, setting the input signal to be the invalid signal, setting the clock signal to be the invalid signal, setting the reset signal to be the valid signal, so as to pull down the potential of the pull-up node and a potential of the output terminal and pull up a potential of a pull-down node; and in a hold stage, setting the input signal to be the invalid signal, setting the clock signal to be the invalid signal, setting the reset signal to be the invalid signal so as to hold the potential of the pull-down node that is pulled up and the potential of the pull-up node that is pulled down and the potential of the output terminal that is pulled down.

For example, the valid signal is a high-voltage signal, and the invalid signal is a low-voltage signal.

In some embodiments, the shift register, the gate drive circuit, the display panel and the driving method provided by the present disclosure allow that, for a display region, a direct-current signal is adopted to drive a gate electrode of a switching transistor in the display region, compared to driving the gate electrode with a clock signal CLK, a dynamic power consumption can be reduced. In some embodiments, the shift register, the gate drive circuit, the display panel and the driving method provided by the present disclosure can avoid the influence of a storage capacitor on a scan output signal and improve display quality.

BRIEF DESCRIPTION OF THE DRAWINGS

In order to demonstrate clearly technical solutions of the embodiments of the present disclosure, the accompanying drawings in relevant embodiments of the present disclosure will be introduced briefly. It is apparent that the drawings may only relate to some embodiments of the disclosure and not intended to limit the present disclosure.

DETAILED DESCRIPTION

Figure 1:
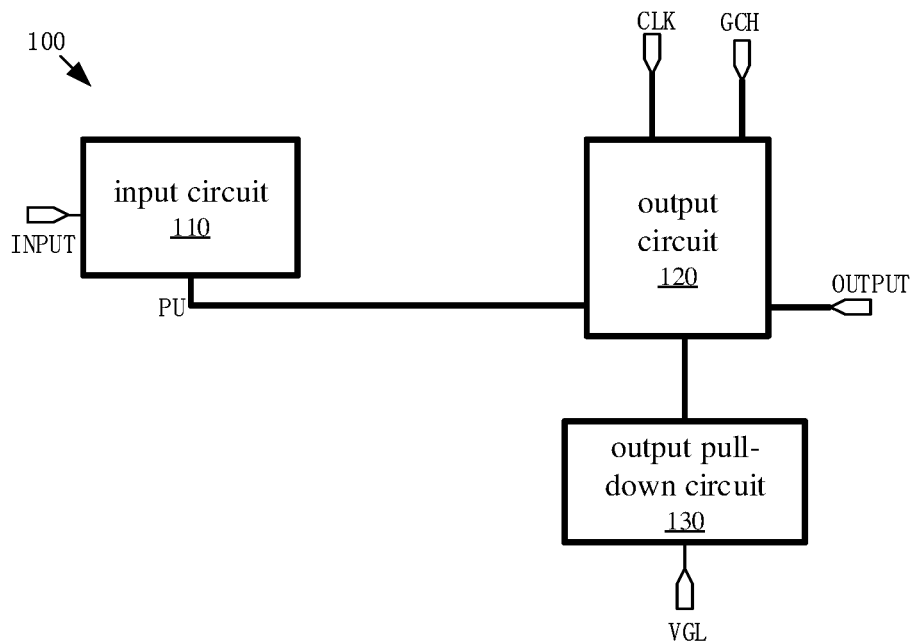
FIG. 1 is a first schematic diagram of a shift register provided by embodiments of the present disclosure.

The technical solutions of the embodiments of the present disclosure will be described clearly and completely hereinafter with reference to the accompanying drawings. Exemplary embodiments of the present disclosure and their various features and advantageous details are described more fully with reference to the non-limited exemplary embodiments illustrated in the accompanying drawings. It should be noted that, the features as shown in the drawings are not necessarily drawn to scale. The present disclosure disregards the description of known materials, components and process techniques so as not to obscure the exemplary embodiments of the present disclosure. The examples are given only to facilitate an understanding of the implementation of the exemplary embodiments of the present disclosure, and to enable those skilled in the art to practice the exemplary embodiments. Therefore, the examples are not to be interpreted as limiting the scope of the embodiments of the present disclosure.

Unless otherwise specifically defined, technical terms or scientific terms used in the present disclosure shall be understood in the ordinary meaning as understood by those having ordinary skill in the art to which the disclosure pertains. The words "first", "second" and similar terms used in the present disclosure do not denote any order, quantity, or importance, but are used to distinguish different components. In addition, in the various embodiments of the present disclosure, the same or similar reference numerals denote the same or similar components.

An embodiment of the present disclosure provides a shift register 100, as shown in FIG. 1, the shift register 100 includes an input circuit 110, an output circuit 120 and an output pull-down circuit 130. The input circuit 110 is respectively connected with a pull-up node PU and an input signal terminal INPUT. The output circuit 120 is respectively connected with the pull-up node PU, a clock signal terminal CLK, a direct-current signal terminal GCH and an output terminal OUTPUT. The clock signal terminal CLK provides a clock signal, the direct-current signal terminal GCH provides a direct-current signal, and the output circuit 120 outputs a scanning signal through the output terminal OUTPUT. The output pull-down circuit 130 is connected with the output circuit 120.

In the above-described shift register 100, the output circuit 120 is configured, in a case where a first output condition is satisfied, to output the scanning signal through the output terminal OUTPUT, and the scanning signal is one of the direct-current signal and the clock signal. The output pull-down circuit 130 is configured, in a case where a second output condition is satisfied, to pull down the scanning signal.

In some embodiments, the output pull-down circuit 130 is configured to write a voltage provided by a first voltage terminal VGL to the output terminal OUTPUT. For example, the scanning signal outputted from the output terminal OUTPUT is pulled down, by the output pull-down circuit 130, to a voltage VGL provided by the first voltage terminal VGL.

Figure 2A:
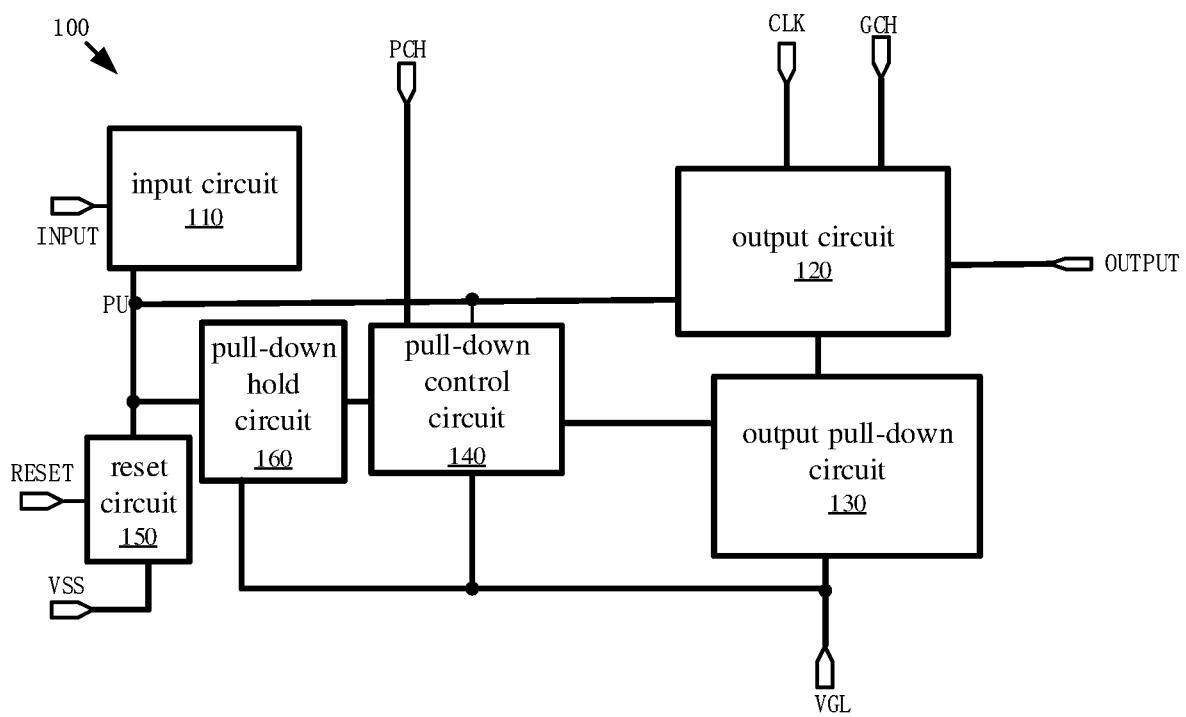
FIG. 2A is a second schematic diagram of a shift register provided by embodiments of the present disclosure.

For example, as shown in FIG. 2A, in some embodiments, the shift register 100 further includes one or more of a pull-down control circuit 140, a reset circuit 150 and a pull-down hold circuit 160.

Figure 2B:
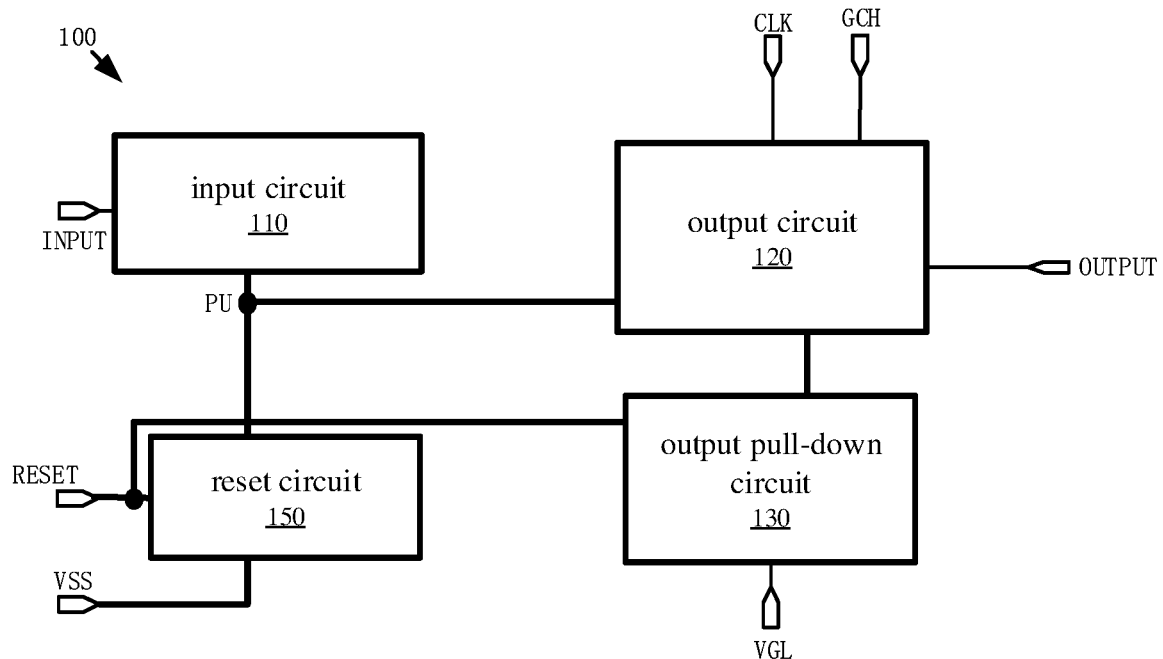
FIG. 2B is a third schematic diagram of a shift register provided by embodiments of the present disclosure.

For example, as shown in FIG. 2B, the shift register 100 can include the input circuit 110, the output circuit 120, the output pull-down circuit 130 and the reset circuit 150. The reset circuit 150 is configured to pull down a potential of the pull-up node PU and control the output pull-down circuit 130 through a reset signal inputted from a reset terminal RESET.

Figure 2C:
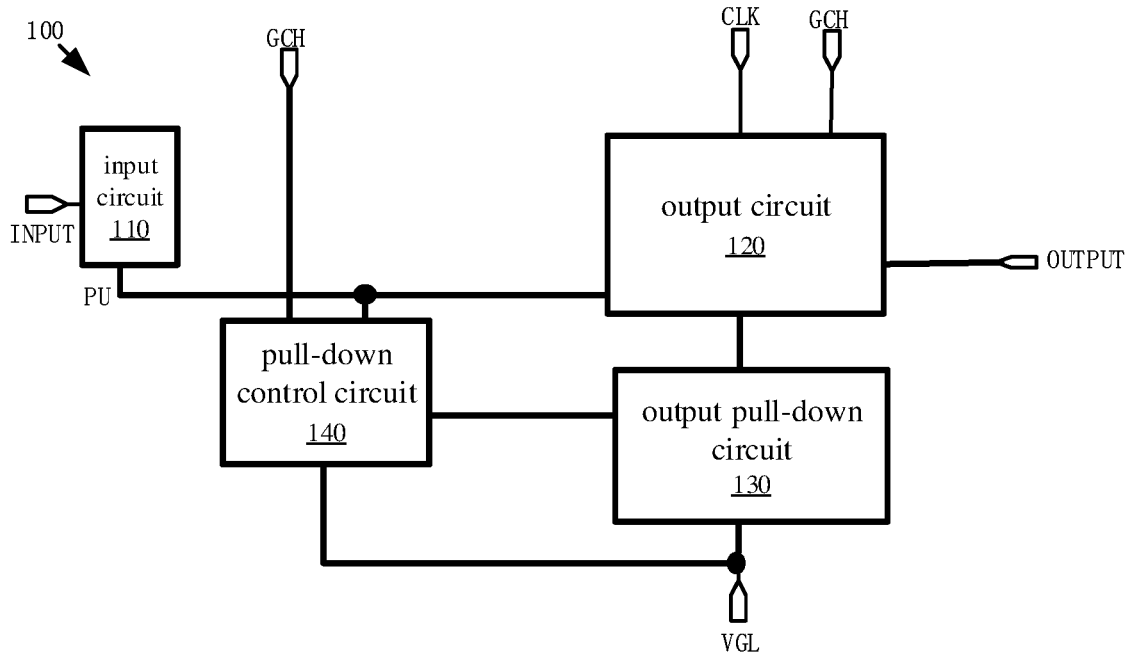
FIG. 2C is a fourth schematic diagram of a shift register provided by embodiments of the present disclosure.

For example, as shown in FIG. 2C, the shift register 100 can include the input circuit 110, the output circuit 120, the output pull-down circuit 130 and the pull-down control circuit 140.

In some embodiments, the pull-down control circuit 140 can be configured to pull down an output voltage of the output terminal OUTPUT by controlling the output pull-down circuit 130. The reset circuit 150 can be configured to pull down the potential of the pull-up node PU. The pull-down hold circuit 160 can be configured to pull down the potential of the node PU, and configured to make the pull-up node PU to be kept at a low potential while the shift register is operating in a hold stage.

Figure 2D:
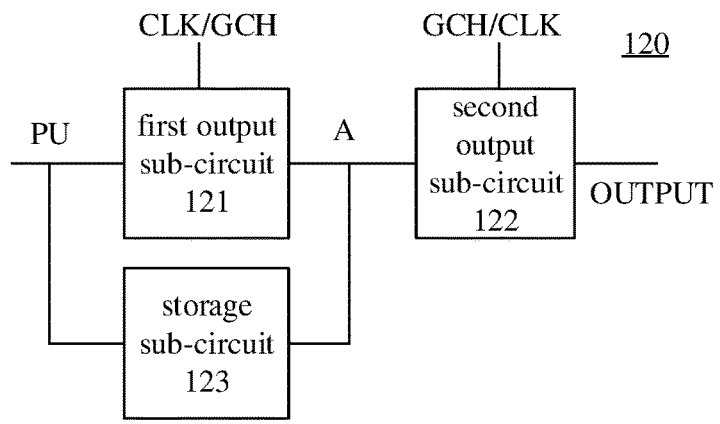
FIG. 2D to FIG. 2F are schematic diagrams of output circuits according to embodiments of the present disclosure.

As shown in FIG. 2D, in examples of these embodiments of the present disclosure, the output circuit 120 includes a first output sub-circuit 121, a second output sub-circuit 122 and a storage sub-circuit 123. In the output circuit 120, the storage sub-circuit 123 is no longer directly connected with the output terminal OUTPUT, but is connected with the output terminal OUTPUT through the second sub-circuit 122, so an adverse effect of the storage sub-circuit 123 on a load of the output terminal OUTPUT can be reduced.

The first output sub-circuit 121 is connected with the pull-up node PU, the storage sub-circuit 123 and an output control node A, and is connected with the clock signal terminal CLK or the direct-current signal terminal GCH. The first output sub-circuit 121 outputs a signal of the clock signal terminal CLK or a signal of the direct-current signal terminal GCH to the output control node A, under control of the pull-up node PU, so as to control a level of the output control node A.

The second output sub-circuit 122 is connected with the output control node A and the output terminal OUTPUT, and is connected with the direct-current signal terminal GCH or the clock signal terminal CLK. Under control of the level of the output control node A, the second output sub-circuit 122 can output the signal of the direct-current signal terminal GCH or the signal of the clock signal terminal CLK to the output terminal OUTPUT as an output signal. That is, one of the first output sub-circuit 121 and the second output sub-circuit 122 is connected with the clock signal terminal CLK, and the other of them is connected with the direct-current signal terminal GCH.

The storage sub-circuit 123 is connected with the pull-up node PU and the output control node A, and is used for storing the potential of the pull-up node PU. The storage sub-circuit 123 can further bootstrap the pull-up node PU to further control the potential of the pull-up node PU when the clock signal is outputted to the output control node A, or keep the potential of the pull-up node PU when the signal of the direct-current signal terminal GCH is outputted to the output control node A.

Figure 2E:
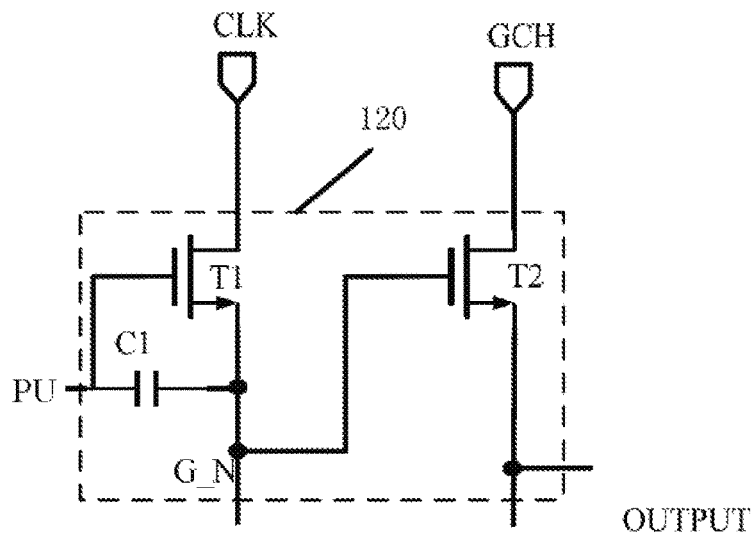

In an example, as shown in FIG. 2E, the output circuit 120 includes a storage capacitor C1, a first output transistor T1 and a second output transistor T2 for respectively implementing the storage sub-circuit 123, the first output sub-circuit 121 and the second output sub-circuit 122. A first electrode of the first output transistor T1 is connected with the clock signal terminal CLK, and a control electrode of the first output transistor T1 is connected with the pull-up node PU. A second electrode of the first output transistor T1 is connected with an output control node G_N, thereby being connected with a control electrode of the second output transistors T2. A first terminal of the storage capacitor C1 is connected with the pull-up node PU, and a second terminal of the storage capacitor C1 is connected with the second electrode of the first output transistor T1. A first electrode of the second output transistor T2 is connected with the direct-current signal terminal GCH, and a second electrode of the second output transistor T2 is connected with the output terminal OUTPUT.

In the example as shown in FIG. 2E, during an operation of the output circuit, the clock signal terminal CLK is not directly connected with the output terminal OUTPUT, that is, the clock signal terminal CLK is separated from a load of a display region of a display panel that is driven, but the direct-current voltage terminal GCH is directly connected with the output terminal OUTPUT, that is, a direct-current voltage signal GCH is used to drive the load of the display region, thereby reducing a dynamic power consumption of the clock signal terminal CLK.

Figure 2F:
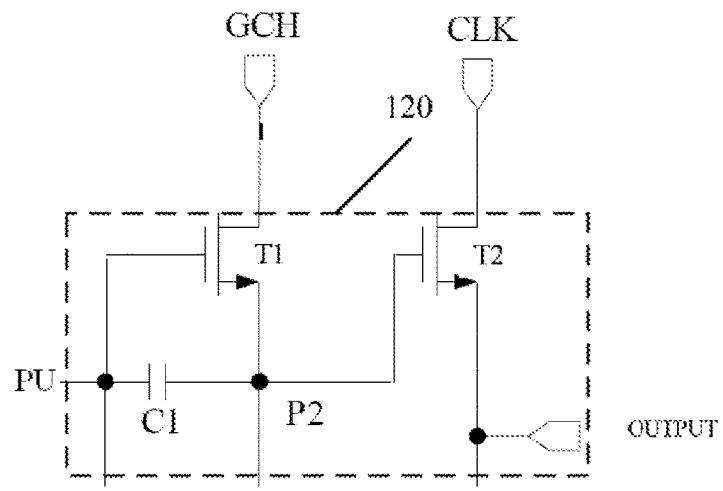

Alternatively, as shown in FIG. 2F, the output circuit 120 includes a storage capacitor C1, a first output transistor T1 and a second output transistor T2 for respectively implementing the storage sub-circuit 123, the first output sub-circuit 121 and the second output sub-circuit 122. A first electrode of the first output transistor T1 is connected with the direct-current signal terminal GCH, and a control electrode of the first output transistor T1 is connected with the pull-up node PU. A second electrode of the first output transistor T1 is connected with an output control node P2, thereby being connected with a control electrode of the second output control transistor T2. A first terminal of the storage capacitor C1 is connected with the pull-up node PU, and a second terminal of the storage capacitor C1 is connected with the second electrode of the first output transistor T1. A first electrode of the second output transistor T2 is connected with the clock signal terminal CLK, and a second electrode of the second output transistor T2 is connected with the output terminal OUTPUT.

In the example as shown in FIG. 2E, the output circuit 120 cancels the bootstrap function of the storage capacitor C1 during the operation of the output circuit 120, and the control electrode (gate electrode) of the second output transistor T2 is driven by a direct-current voltage inputted through the first output transistor T1. Therefore, it is possible to avoid the influence of the storage capacitor C1 on the scanning signal (a load thereof) outputted by the output terminal OUTPUT.

Another embodiment of the present disclosure provides a shift register including an input circuit, an output circuit and an output pull-down circuit. The input circuit is respectively connected with a pull-up node and an input signal terminal. The output circuit is respectively connected with the pull-up node, a clock signal terminal, a direct-current signal terminal and an output terminal. The output pull-down circuit is connected with the output circuit. The clock signal terminal provides a clock signal, the direct-current signal terminal provides a direct-current signal, and the output circuit outputs a scanning signal through the output terminal. The output circuit includes a first output sub-circuit, a second output sub-circuit and a storage sub-circuit. The first output sub-circuit and the storage sub-circuit are connected with the pull-up node, and the first output sub-circuit and the storage sub-circuit cooperate to control a level of an output control node. The second output sub-circuit is connected with the output terminal, and the second output sub-circuit controls, through the level of the output control node, whether the scanning signal is outputted at the output terminal.

Exemplary circuit structures of the shift register 100 and a gate drive circuit 10 will be described in detail below with reference to FIG. 3-FIG. 4.

Figure 3:
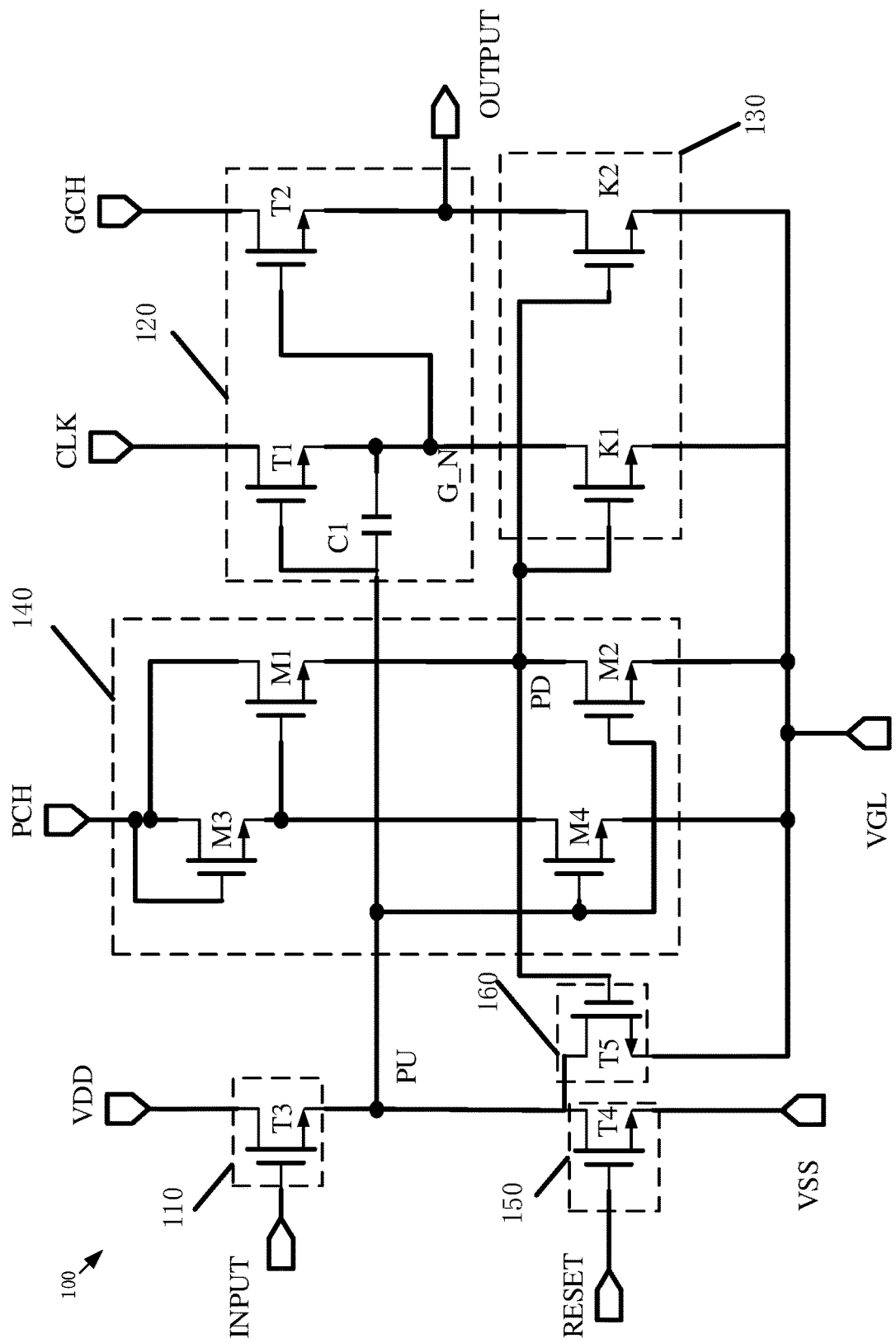
FIG. 3 is a first schematic circuit structural diagram of a shift register provided by embodiments of the present disclosure.

As shown in FIG. 3, the shift register 100 includes an input circuit 110, an output circuit 120 and an output pull-down circuit 130. The output circuit 120 can include a storage capacitor C1, a first output transistor T1 and a second output transistor T2.

In a case where a first output condition is satisfied (for example, when the second output transistor T2 in FIG. 3 is conductive or turned on), the output circuit 120 can be configured to output a direct-current signal, which is from a direct-current signal terminal GCH, to an output terminal OUTPUT. A first electrode of the first output transistor T1 is connected with a clock signal terminal CLK, a control electrode of the first output transistor T1 is connected with a pull-up node PU, and a second electrode of the first output transistor T1 is connected with a control electrode of the second output transistor T2. A first terminal of the storage capacitor C1 is connected with the pull-up node PU, and a second terminal of the storage capacitor C1 is connected with the second electrode of the first output transistor T1. A first electrode of the second output transistor T2 is connected with the direct-current signal terminal GCH, and a second electrode of the second output transistor T2 is connected with the output terminal OUTPUT.

It should be noted that the transistors adopted in the embodiments of the present disclosure can be thin film transistors, field-effect transistors or other switching devices with the required characteristics. The control electrode of the transistor is the gate electrode of the transistor. Source electrodes and drain electrodes of the transistors adopted herein can be symmetrical in structure, so the source electrodes and drain electrodes are not different structurally. In the embodiment of the present disclosure, in order to distinguish between the two electrodes of a transistor other than a gate electrode, it is directly described that one of the two electrodes is a first electrode and the other electrode is a second electrode. Therefore, the first electrode and the second electrode of all or part of the transistors in the embodiments of the present disclosure are interchangeable as needed. For example, the first electrode of the transistor of the embodiment of the present disclosure can be a source electrode, and the second electrode of the transistor can be a drain electrode; or, the first electrode of the transistor is a drain electrode, and the second electrode of the transistor is a source electrode. In addition, the transistors can be divided into n-type transistors or p-type transistors according to characteristics of the transistors. When a transistor is a p-type transistor, turn-on voltage of the transistor is a low-level voltage (for example, 0V, −5V, or other appropriate voltage), and turn-off voltage of the transistor is a high-level voltage (for example, 5V, 10V, or other appropriate voltage). When a transistor is an n-type transistor, turn-on voltage of the transistor is a high-level voltage (for example, 5V, 10V, or other appropriate voltage), and turn-off voltage of the transistor is a low-level voltage (for example, 0V, −5V, or other appropriate voltage).

It should be noted that the embodiments of the present disclosure are described by taking an example in which each transistor is an n-type transistor. Based on the descriptions and teachings of the implementation of the present disclosure, those skilled in the art can realize the implementation of the p-type transistor or the combination of the n-type transistor and p-type transistor adopted in the embodiments of the present disclosure without creative efforts. Therefore, these implementations are also within the scope of the present disclosure.

For example, as shown in FIG. 3, in some embodiments, the pull-down control circuit 140 is configured to be connected with a first voltage terminal VGL and a second voltage terminal PCH. In some embodiments, a voltage inputted by the second voltage terminal PCH and a voltage input by the direct-current voltage terminal GCH can be the same. For example, the second voltage terminal PCH and the direct-current voltage terminal GCH are the same voltage terminal.

As shown in FIG. 3, the pull-down control circuit 140 can include a first control transistor M1, a second control transistor M2, a third control transistor M3 and a fourth control transistor M4. A first electrode of the first control transistor M1 is configured to be connected with the second voltage terminal PCH, and a second electrode of the first control transistor M1 is connected with a pull-down node PD; a first electrode of the second control transistor M2 is connected with the pull-down node PD, a control electrode of the second control transistor M2 is connected with the pull-up node PU, and a second electrode of the second control transistor M2 is configured to be connected with the first voltage terminal VGL; a first electrode of the third control transistor M3 is configured to be connected with the second voltage terminal PCH, a control electrode of the third control transistor M3 is configured to be connected with the second voltage terminal PCH, and a second electrode of the third control transistor M3 is connected with a control electrode of the first control transistor M1; a first electrode of the fourth control transistor M4 is connected with the second electrode of the third control transistor M3, a control electrode of the fourth control transistor M4 is connected with the pull-up node PU, and a second electrode of the fourth control transistor M4 is configured to be connected with the first voltage terminal VGL.

It should be noted that the pull-down control circuit 140 as shown in FIG. 3 is only an example of the embodiment of the present disclosure, and the embodiments of the present disclosure include but are not limited to the case as shown in FIG. 3.

As shown in FIG. 3, in some embodiments, the output pull-down circuit 130 can include a first output pull-down transistor K1 and a second output pull-down transistor K2. A first electrode of the first output pull-down transistor K1 is connected with the second electrode of the first output transistor T1, a control electrode of the first output pull-down transistor K1 is connected with the pull-down node PD, and a second electrode of the first output pull-down transistor K1 is configured to be connected with the first voltage terminal VGL. A first electrode of the second output pull-down transistor K2 is connected with the output terminal OUTPUT, a control electrode of the second output pull-down transistor K2 is connected with the pull-down node PD, and a second electrode of the second output pull-down transistor K2 is configured to be connected with the first voltage terminal VGL.

For example, in a case where the second output condition is satisfied (that is, when the second output pull-down transistor K2 is conductive or turned on), the output pull-down circuit 130 is configured to pull down the scanning signal to the potential of VGL.

As shown in FIG. 3, in some embodiments, the reset circuit 150 is configured to receive a third voltage signal from a third voltage terminal VSS so as to reset the output circuit 120 in a case where a reset condition is satisfied (for example, a reset transistor T4 as shown in FIG. 3 is turned on).

For example, the reset circuit 150 as shown in FIG. 3 includes a reset transistor T4. A control electrode of the reset transistor T4 is connected with a reset signal terminal RESET, a first electrode of the reset transistor T4 is connected with the pull-up node PU, and a second electrode of the reset transistor T4 is connected with the third voltage terminal VSS.

For example, in some embodiments, if the shift register 100 does not include the pull-down control circuit 140 (as shown in FIG. 2B), the control electrode of the first output pull-down transistor K1 of the output pull-down circuit 130 and the control electrode of the second output pull-down transistor K2 of the output pull-down circuit 130 can both be connected with the reset signal terminal RESET.

It should be noted that the reset circuit 150 as shown in FIG. 3 is only an example of the embodiment of the present disclosure, and the embodiments of the present disclosure include but are not limited to the case as shown in FIG. 3.

As shown in FIG. 3, in some embodiments, the pull-down hold circuit 160 is configured to pull down the potential of the pull-up node PU in a case where a pull-down condition of the pull-up node PU is satisfied.

For example, as shown in FIG. 3, the pull-down hold circuit 160 can include a pull-down hold transistor T5. A control electrode of the pull-down hold transistor T5 is connected with the pull-down node PD, a first electrode of the pull-down hold transistor T5 is connected with the pull-up node PU, and a second electrode of the pull-down hold transistor T5 is configured to be connected with the first voltage terminal VGL. For example, in a case where the pull-down condition of the pull-up node PU is satisfied (for example, when the pull-down hold transistor T5 is conductive or turned on), the potential of the pull-up node PU is pulled down to the potential of VGL.

It should be noted that the pull-down hold circuit 160 as shown in FIG. 3 is only an example of the embodiment of the present disclosure, and the embodiments of the present disclosure include but are not limited to the case as shown in FIG. 3.

As shown in FIG. 3, in some embodiments, the input circuit 110 can include an input transistor T3, a control electrode of the input transistor T3 is connected with an input signal terminal INPUT, a first electrode of the input transistor T3 is connected with a fourth voltage terminal VDD, and a second electrode of the input transistor T3 is connected with the pull-up node PU.

It should be noted that the input circuit 110 as shown in FIG. 3 is only an example of the embodiment of the present disclosure, and the embodiments of the present disclosure include but are not limited to the case as shown in FIG. 3.

A process of driving the circuit of FIG. 3 is exemplarily described below with reference to FIG. 3 and a timing diagram of FIG. 4. In FIG. 3, the node connecting the second electrode of the first output transistor T1 and the control electrode of the second output transistor T2 is a node G_N.

A first stage is an input stage. In the input stage, the reset signal of the reset signal terminal RESET and the clock signal of the clock signal terminal CLK are set to be a low level, and the input signal of the input terminal INPUT is set to be a high level.

Because the reset signal is at the low level, the reset transistor T4 is turned off; the input signal is at the high level, the input transistor T3 is turned on, and the storage capacitor C1 is charged through the input transistor T3. At this time, the pull-up node PU is at the high level, and the second control transistor M2 and the fourth control transistor M4 are turned on. The pull-down node PD is at the low level, and the first pull-down transistor K1, the second pull-down transistor K2 and the pull-down hold transistor T5 are all turned off to ensure normal input. Because the pull-up node PU is at the high level, the first output transistor T1 is turned on, the clock signal is at the low level, so the node G_N outputs the low level, the second output transistor T2 is turned off, and the output terminal OUTPUT outputs the low level.

A second stage is an output stage, the input signal and the reset signal are at the low level, and the clock signal is at the high level. Due to the hold function of the storage capacitor C1, the pull-up node PU is at the high level, the first output transistor T1 is turned on, and the clock signal is at the high level, so the node G_N outputs the high level. The second output transistor T2 is turned on, so the output terminal OUTPUT outputs the high level. At this time, the pull-down node PD is at the low level, and the pull-down hold transistor T5, the first pull-down transistor K1 and the second pull-down transistor K2 are all turned off to ensure normal output.

A third stage is a reset stage. At this time, the clock signal and the input signal are at the low level, and the reset signal is at the high level. Because the reset signal is at the high level, the reset transistor T4 is turned on, the pull-up node PU is at the low level, and the second control transistor M2 and the fourth control transistor M4 are turned off. The pull-down node PD is at the high level, and the pull-down hold transistor T5, the first pull-down transistor K1 and the second pull-down transistor K2 are turned on. The signals of the pull-up node PU, the node G_N and the output terminal are all at the low level.

A fourth stage is a hold stage, and the clock signal, the input signal and the reset signal are all at the low level. Because the clock signal, the input signal and the reset signal are all at the low level, the input transistor T3 and the reset transistor T4 are turned off. The pull-up node PU is at the low level, and the second control transistor M2 and the fourth control transistor M4 are turned off. The pull-down node PD is at the high level, the pull-down hold transistor T5, the first pull-down transistor K1 and the second pull-down transistor K2 are turned on, and the potentials of the pull-up node PU, the node G_N and the output terminal OUTPUT are kept at the low level.

The gate drive circuit including the shift register 100 described above operates in the fourth stage after entering the fourth stage and before the arrival of the next frame.

A structure of the gate drive circuit 10 including the shift register 100 as shown in FIG. 3 will be described below with reference to FIG. 5.

Figure 5:
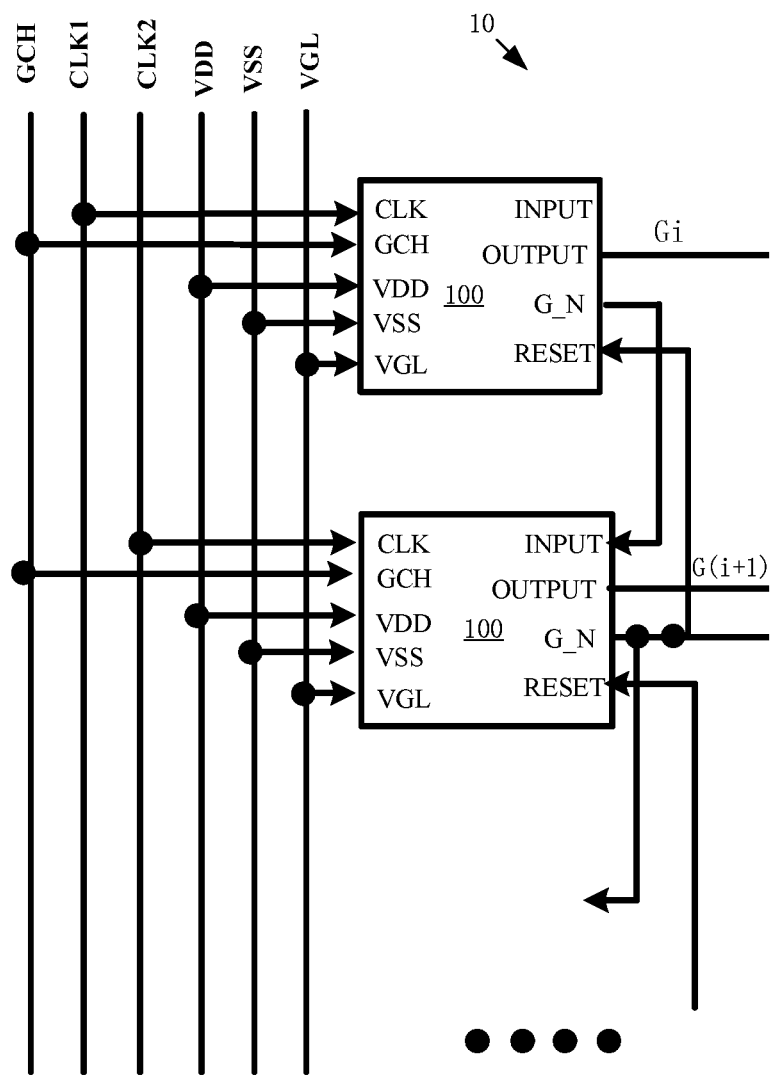
FIG. 5 is a first cascade diagram of a plurality of shift registers provided by embodiments of the present disclosure.

As shown in FIG. 5, the gate drive circuit 10 can include a plurality of cascaded shift registers (for example, two cascaded shift registers 100 as shown in FIG. 5). Each shift register can be a shift register 100 provided by any embodiment of the present disclosure. Except the first-stage shift register and the last-stage shift register 100, an input signal terminal INPUT of a shift register 100 of a present stage is connected with a node G_N of a shift register of a preceding stage; and a reset signal terminal RESET of the shift register of the present stage is connected with a node G_N of a shift register 100 of a next stage.

For example, the gate drive circuit 10 includes n cascaded shift registers 100, the output terminals OUTPUT of the n cascaded shift registers are respectively connected with gate lines (G1, G2 . . . Gi, G(i+1) . . . Gn) of a display panel, the value range of i is greater than or equal to 0, and less than or equal to n, and both i and n are positive integers. For example, the first clock signal terminal CLK1 and the second clock signal terminal CLK2 in FIG. 5 are complementary, and thus the cascade of shift registers can be implemented.

In FIG. 5, the second voltage terminal PCH and the direct-current voltage terminal GCH for each shift register are the same voltage terminal.

The above embodiment of the present disclosure control the output of the second output transistor T2 by the potential of the node G_N as shown in FIG. 3, which can effectively avoid an output delay of the output transistor by the storage capacitor C1. With reference to the descriptions of FIGS. 3-5, the shift register and the gate drive circuit provided by the above embodiments of the present disclosure can avoid the influence of the storage capacitor C1 on the scanning signal outputted by the output terminal OUTPUT, thereby improving display quality.

Moreover, in the present embodiment, by adding the second output transistor T2, the clock signal terminal CLK is not directly connected with the output terminal OUTPUT in the output stage, that is, the clock signal terminal CLK is separated from the load of the display region of the display panel that is driven, but the direct-current voltage terminal GCH is directly connected with the output terminal OUTPUT, that is, the direct-current voltage signal GCH is used to drive the load of the display region. Therefore, this embodiment can reduce the dynamic power consumption of the clock signal terminal CLK, and contribute to improving display quality of the display panel.

It should be noted that, because the gate drive circuit 10 provided by the embodiment of the present disclosure can implement a forward scanning and an inverse scanning, when a scanning direction is switched, a "preceding stage" and a "next stage" of a timing are exchanged accordingly. Therefore, the above-mentioned "preceding stage" and a "next stage" do not refer to a preceding stage and a next stage of the scanning timing, but refer to a preceding stage and a next stage of a physical connection.

Figure 4:
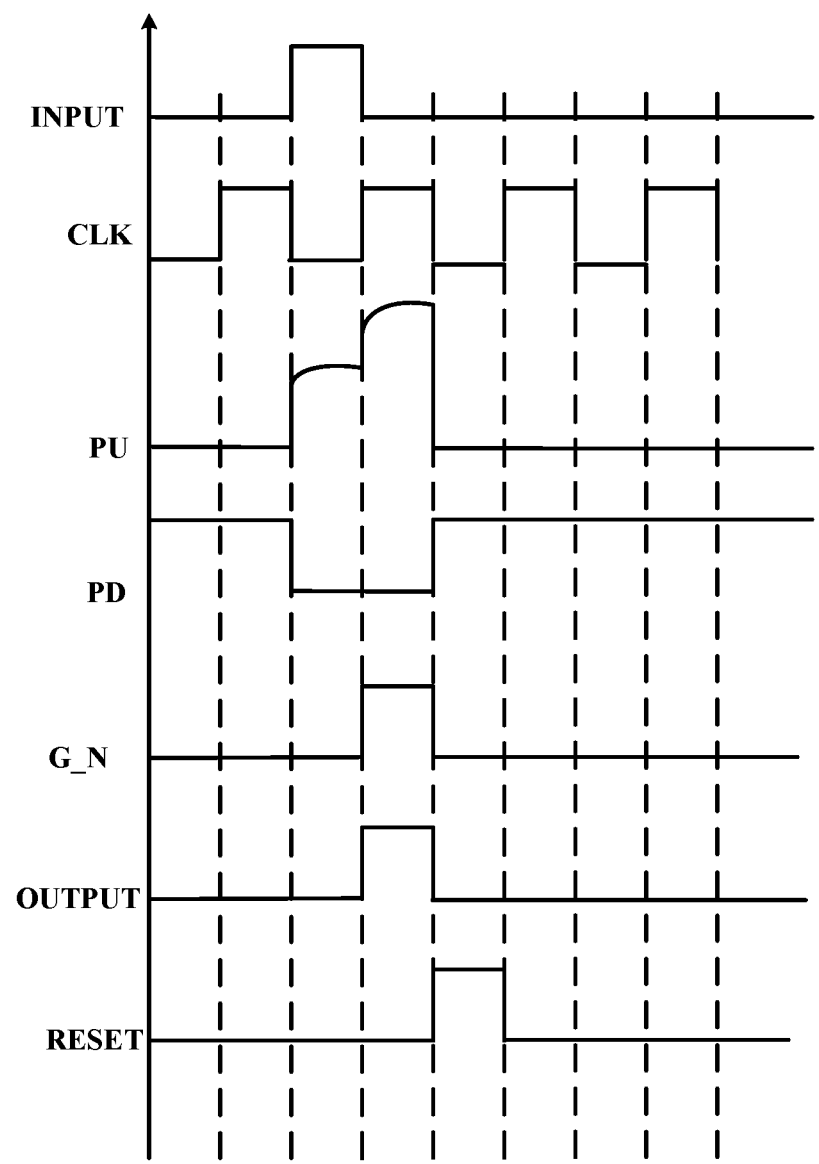
FIG. 4 is a driving timing diagram of the shift register as shown in FIG. 3 provided by embodiments of the present disclosure.

In combination with the descriptions of FIGS. 3-5, the shift register 100 and the gate drive circuit 10 provided by the embodiments of the present disclosure allow that, for the display region, a direct-current signal is adopted to drive the gate electrode of the switching transistor in the display region, compared to driving the gate electrode with the clock signal CLK, the dynamic power consumption can be reduced.

Figure 6:
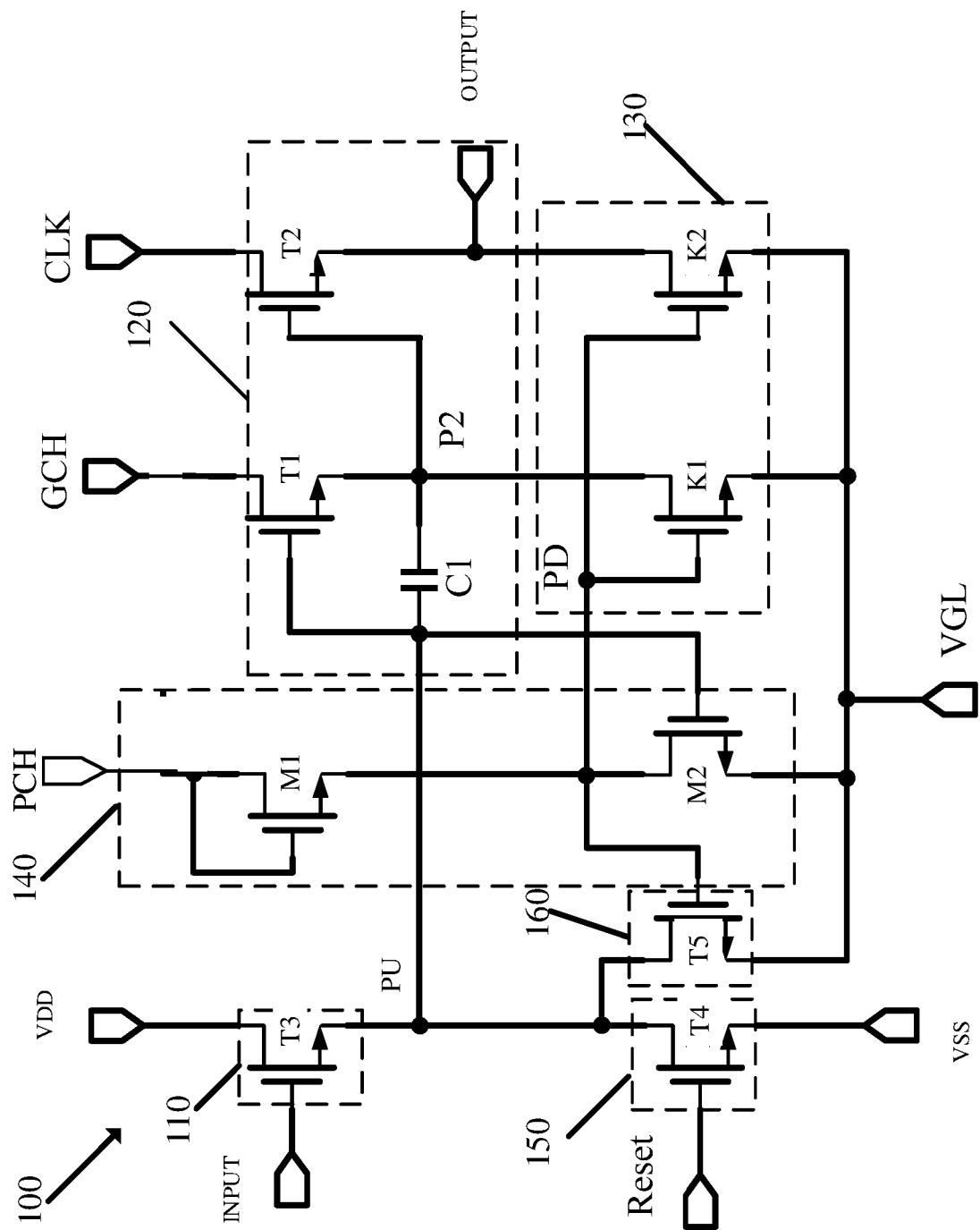
FIG. 6 is a second schematic circuit structural diagram of a shift register provided by embodiments of the present disclosure.
Figure 7:
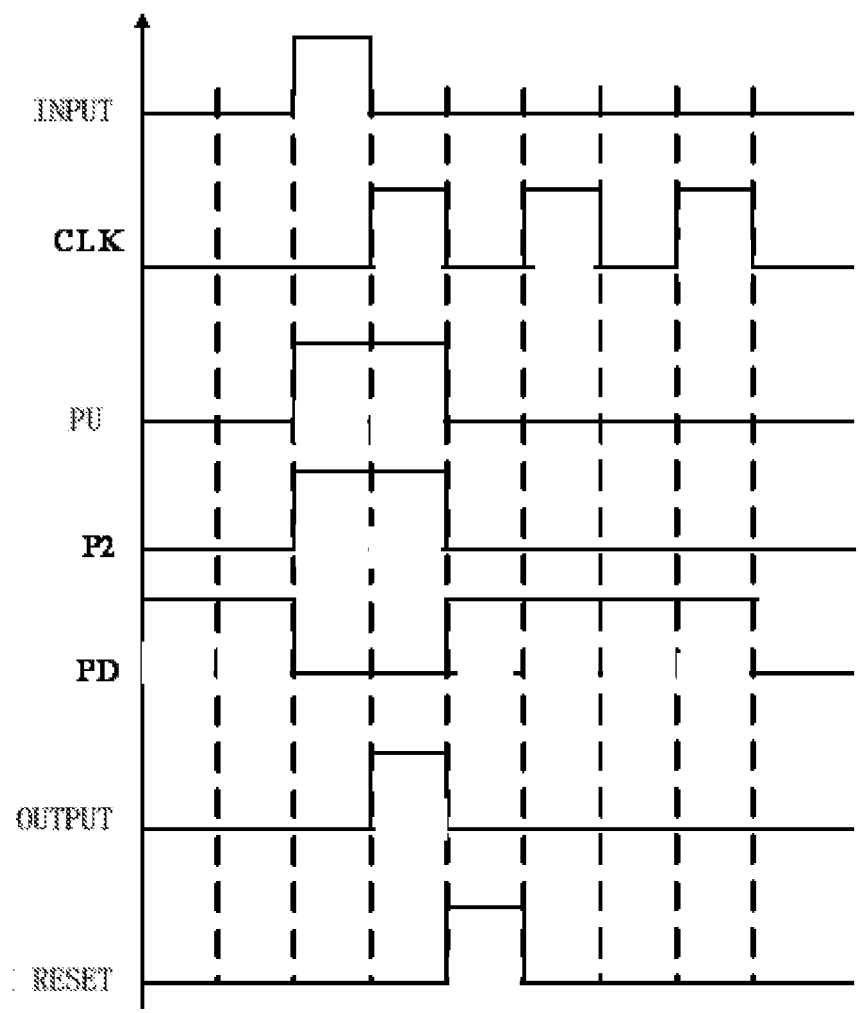
FIG. 7 is a driving timing diagram of the shift register as shown in FIG. 6 provided by embodiments of the present disclosure.

Another exemplary circuit structure of the shift register 100 and the gate drive circuit 10 will be described in detail below with reference to FIGS. 6-8. As shown in FIG. 6, the output circuit 120 can include a storage capacitor C1, a first output transistor T1 and a second output transistor T2.

In some embodiments, in a case where the first output condition is satisfied (for example, when the second output transistor T2 in FIG. 6 is turned on), the output circuit 120 is configured to output the clock signal, which is from the clock signal terminal CLK, through the output terminal OUTPUT. A first electrode of the first output transistor T1 is connected with the direct-current signal terminal GCH, a control electrode of the first output transistor T1 is connected with the pull-up node PU, and a second electrode P2 of the first output transistor T1 is connected with a control electrode of the second output transistor T2. A first terminal of the storage capacitor C1 is connected with the pull-up node PU, and a second terminal of the storage capacitor C1 is connected with the second electrode of the first output transistor T1. A first electrode of the second output transistor T2 is connected with the clock signal terminal CLK, and a second electrode of the second output transistor T2 is connected with the output terminal OUTPUT.

For example, as shown in FIG. 6, in some embodiments, the pull-down control circuit 140 can include a first control transistor M1 and a second control transistor M2. A first electrode of the first control transistor M1 is configured to be connected with the second voltage terminal PCH, a control electrode of the first control transistor M1 is configured to be connected with the second voltage terminal PCH, and a second electrode of the first control transistor M1 is connected with the pull-down node PD. A first electrode of the second control transistor M2 is connected with the pull-down node PD, a second electrode of the second control transistor M2 is configured to be connected with the first voltage terminal VGL, and a control electrode of the second control transistor M2 is connected with the pull-up node PU. For example, the voltage inputted by the second voltage terminal PCH can be the same as the voltage inputted by the direct-current voltage terminal GCH. For example, the second voltage terminal PCH and the direct-current voltage terminal GCH are the same voltage terminal.

It should be noted that the pull-down control circuit 140 as shown in FIG. 6 is only an example of the embodiment of the present disclosure, and the embodiments of the present disclosure include but are not limited to the case as shown in FIG. 6.

For example, as shown in FIG. 6, in some embodiments, the output pull-down circuit 130 can include a first output pull-down transistor K1 and a second output pull-down transistor K2. A first electrode of the first output pull-down transistor K1 is connected with the second electrode of the first output transistor T1, a control electrode of the first output pull-down transistor K1 is connected with the pull-down node PD, and a second electrode of the first output pull-down transistor K1 is configured to be connected with the first voltage terminal VGL. A first electrode of the second output pull-down transistor K2 is connected with the output terminal OUTPUT, a control electrode of the second output pull-down transistor K2 is connected with the pull-down node PD, and a second electrode of the second output pull-down transistor K2 is configured to be connected with the first voltage terminal VGL.

For example, in a case where the second output condition is satisfied (that is, when the second output pull-down transistor K2 is conductive or turned on), the output pull-down circuit 130 is configured to pull down the scanning signal to the potential of VGL.

For example, the circuit structure of the pull-down control circuit 140 in FIG. 6 can further adopt the circuit structure of the pull-down control circuit 140 as shown in FIG. 3; similarly, the circuit structure of the pull-down control circuit 140 in FIG. 3 can further adopt the circuit structure of the pull-down control circuit 140 as shown in FIG. 6.

For example, in some embodiments, in a case where the reset condition is satisfied (for example, a reset transistor T4 as shown in FIG. 6 is turned on), the reset circuit 150 is configured to receive the third voltage signal from the third voltage terminal VSS so as to reset the output circuit 120.

For example, as shown in FIG. 6, in some embodiments, the reset circuit 150 includes the reset transistor T4. A control electrode of the reset transistor T4 is connected with the reset signal terminal RESET, a first electrode of the reset transistor T4 is connected with the pull-up node PU, and a second electrode of the reset transistor T4 is connected with the third voltage terminal VSS.

In some embodiments, if the shift register 100 does not include the pull-down control circuit 140 (as shown in FIG. 2B), the control electrode of the first output pull-down transistor K1 of the output pull-down circuit 130 and the control electrode of the second output pull-down transistor K2 of the output pull-down circuit 130 can both be connected with the reset signal terminal RESET.

It should be noted that the reset circuit 150 as shown in FIG. 6 is only an example of the embodiment of the present disclosure, and the embodiments of the present disclosure include but are not limited to the case as shown in FIG. 6.

As shown in FIG. 6, in some embodiments, the pull-down hold circuit 160 is configured to pull down the potential of the pull-up node PU in a case where the pull-down condition of the pull-up node PU is satisfied.

For example, as shown in FIG. 6, in some embodiments, the pull-down hold circuit 160 can include a pull-down hold transistor T5. A control electrode of the pull-down hold transistor T5 is connected with the pull-down node PD, a first electrode of the pull-down hold transistor T5 is connected with the pull-up node PU, and a second electrode of the pull-down hold transistor T5 is configured to be connected with the first voltage terminal VGL. For example, in a case where the pull-down condition of the pull-up node PU is satisfied (for example, when the pull-down hold transistor T5 is conductive or turned on), the potential of the pull-up node PU is pulled down to the potential of VGL.

It should be noted that the pull-down hold circuit 160 as shown in FIG. 6 is only an example of the embodiment of the present disclosure, and the embodiments of the present disclosure include but are not limited to the case as shown in FIG. 6.

As shown in FIG. 6, in some embodiments, the input circuit 110 can include an input transistor T3, a control electrode of the input transistor T3 is connected with an input signal terminal INPUT, a first electrode of the input transistor T3 is connected with a fourth voltage terminal VDD, and a second electrode of the input transistor T3 is connected with the pull-up node PU.

It should be noted that the input circuit 110 as shown in FIG. 6 is only an example of the embodiment of the present disclosure, and the embodiments of the present disclosure include but are not limited to the case as shown in FIG. 6.

In some embodiments, the second voltage terminal PCH and the direct-current voltage terminal GCH as shown in FIG. 6 are combined into one direct-current voltage input terminal.

A process of driving the circuit of FIG. 6 is exemplarily described below with reference to a timing diagram of FIG. 7. The node connecting the second electrode of the first output transistor T1 and the control electrode of the second output transistor T2 is a node P2.

In the forward scanning, the forward scanning control signal is at a high level, and the inverse scanning control signal is at a low level; and in the inverse scanning, the forward scanning control signal is at the low level, and the inverse scanning control signal is at the high level. The following is a description of the driving principle by taking the forward scanning as an example.

An input stage: the input signal of the input terminal INPUT is at the high level, and the reset signal of the reset signal terminal RESET and the clock signal of the clock signal terminal CLK are at the low level.

Because the reset signal is at the low level, the reset transistor T4 is turned off. The input signal is at the high level, the input transistor T3 is turned on, the storage capacitor C1 is charged, and the pull-up node PU is at the high level. When the pull-up node PU is at the high level, the second control transistor M2 is turned on. When the second control transistor M2 is turned on, the pull-down node PD is pulled down to the voltage VGL of the first voltage terminal. When the pull-down node PD is at the low level, the first pull-down transistor K1, the second pull-down transistor K2 and the pull-down hold transistor T5 are turned off to ensure normal input. When the pull-up node PU is at the high level, the first output transistor T1 is turned on, the potential of the node P2 is at the high level, and the second output transistor T2 is turned on. Because the clock signal is at the low level, the output terminal OUTPUT outputs the low level.

An output stage: the clock signal is at the high level, and the input signal and the reset signal are at the low level.

Because the reset signal and the input signal are at the low level, the input transistor T3 and the reset transistor T4 are turned off. Due to the hold function of the storage capacitor C1, the pull-up node PU is at the high level, and the second control transistor M2 and the first output transistor T1 are turned on. The pull-down node PD is still at the low level, the first pull-down transistor K1, the second pull-down transistor K2 and the pull-down hold transistor T5 are turned off to ensure normal output. Because the node P2 is still at the high level, the second output transistor T2 is turned on, the clock signal is at the high level, and the output terminal OUTPUT outputs the high level.

A reset stage: the reset signal is at the high level, and the input signal and the clock signal are at the low level.

Because the input signal is at the low level, the input transistor T3 is turned off; the reset signal is at the high level, the reset transistor T4 is turned on, and the storage capacitor C1 is discharged through the reset transistor T4; the pull-up node PU is at the low level, and the second control transistor M2 and the first output transistor T1 is turned off; the pull-down node PD is at the high level, and the first pull-down transistor K1, the second pull-down transistor K2 and the pull-down hold transistor T5 are turned on. The pull-up node PU, the node P2 and the output terminal OUTPUT are pulled down to a low level.

A hold stage: the input signal and the reset signal are both at the low level.

At this time, the input signal and the reset signal are at the low level, the input transistor T3 and the reset transistor T4 are turned off; at this time, the pull-up node PU is at the low level, the second control transistor M2 and the first output transistor T1 are turned off; the pull-down node PD is at the high level, the first pull-down transistor K1, the second pull-down transistor K2 and the pull-down hold transistor T5 are turned on, which ensuring that the pull-up node PU, the node P2 and the output terminal to be kept at the low level to ensure the normal display.

The shift register 100 repeats the hold stage after entering the hold stage and before the next frame arrives.

The embodiments of the present disclosure control the output of the second output transistor T2 by the potential of the node P2 as shown in FIG. 6, which can effectively avoid an output delay of the output transistor by the storage capacitor C1. With reference to the descriptions of FIGS. 6-8, the shift register and the gate drive circuit provided by the above embodiments of the present disclosure cancel the bootstrap function of the storage capacitor C1 during the operation of the output circuit, and the gate electrode of the second output transistor T2 is driven by the direct-current voltage inputted by the first output transistor T1, thereby avoid the influence of the storage capacitor C1 on the scanning signal (a load thereof) outputted by the output terminal OUTPUT, and improve display quality.

Figure 8:
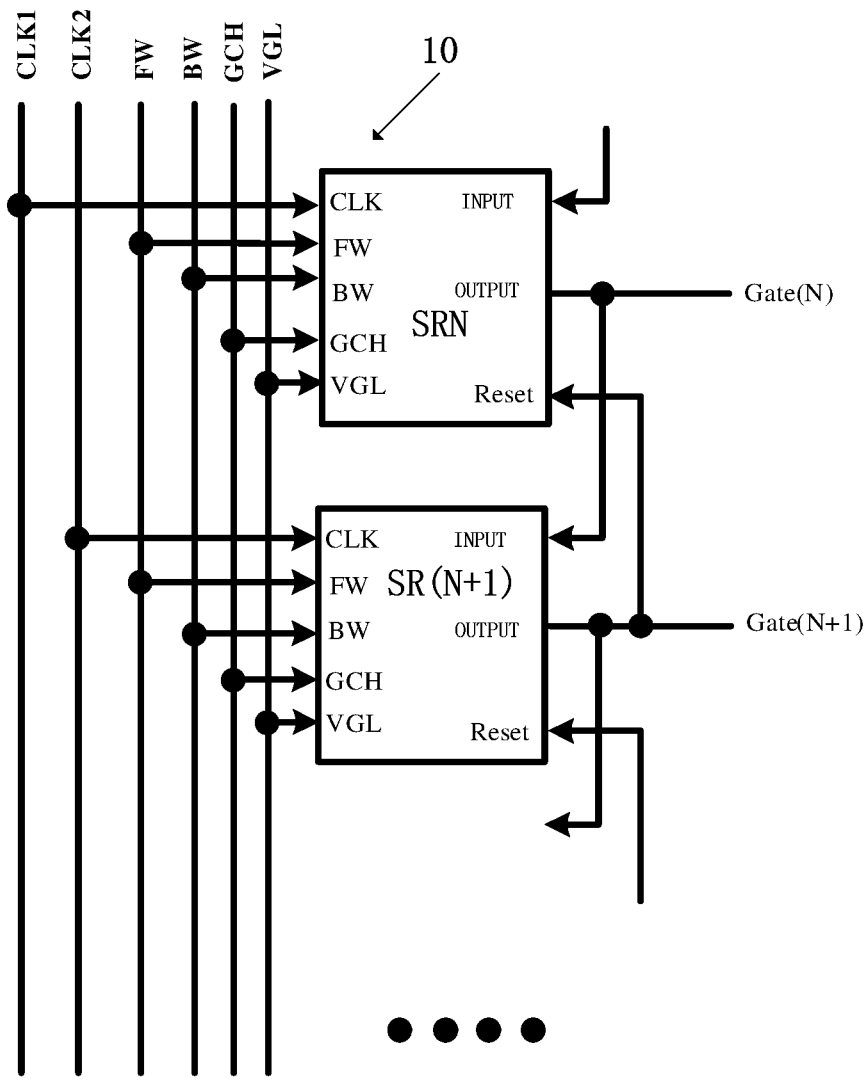
FIG. 8 is a second cascade diagram of a plurality of shift registers provided by embodiments of the present disclosure.

As shown in FIG. 8, the FIG. 8 provides a gate drive circuit 10. The gate drive circuit 10 can include a plurality of cascaded shift registers 100 provided by any embodiment of the present disclosure. Except the first-stage shift register and the last-stage shift register 100, an input signal terminal INPUT of a shift register 100 of present stage is connected with an output terminal OUTPUT of a shift register of a preceding stage; and a reset signal terminal RESET of the shift register of present stage is connected with an output terminal OUTPUT of a shift register of a next stage.

For example, as shown in FIG. 8, when the gate drive circuit 10 is scanning forward, a forward scanning control signal terminal FW inputs a high level, and an inverse scanning control signal terminal BW inputs a low level; when the gate drive circuit 10 is scanning backward, the inverse scanning control signal terminal BW inputs the high level, and the forward scanning control signal terminal FW inputs the low level. For example, when the forward scanning and the inverse scanning are switched, the function of the input circuit of the shift register 100 is interchanged with the function of the reset circuit of the shift register 100.

For example, the gate drive circuit 10 includes n cascaded shift registers SR(1), SR(2) . . . SR(n), SR(n+1) . . . SR(N), the value range of n is greater than or equal to 0 and less than or equal to the total number of the shift registers 100 N (n≤N), n and N are both positive integers, and these shift registers each can be the shift register 100 provided by any of the embodiments of the present disclosure. The output terminals OUTPUT of the shift register SR(1), SR(2) . . . SR(n), SR(n+1) . . . SR(N) are respectively connected with the gate lines Gate(1), Gate(2) . . . Gate(n), Gate(n+1) . . . Gate (N). For example, the first clock signal terminal CLK1 and the second clock signal terminal CLK2 in FIG. 8 are complementary, and the cascade of shift registers can be implemented.

It should be noted that, because the gate drive circuit 10 provided by the embodiment of the present disclosure can implement a forward scanning and an inverse scanning, when a scanning direction is switched, a "preceding stage" and a "next stage" of a timing are exchanged accordingly. Therefore, the above-mentioned "preceding stage" and a "next stage" do not refer to a preceding stage and a next stage of a scanning timing, but refer to a preceding stage and a next stage of a physical connection.

In FIG. 8, the second voltage terminal PCH and the direct-current voltage terminal GCH of each shift register are the same voltage terminal.

Figure 9:
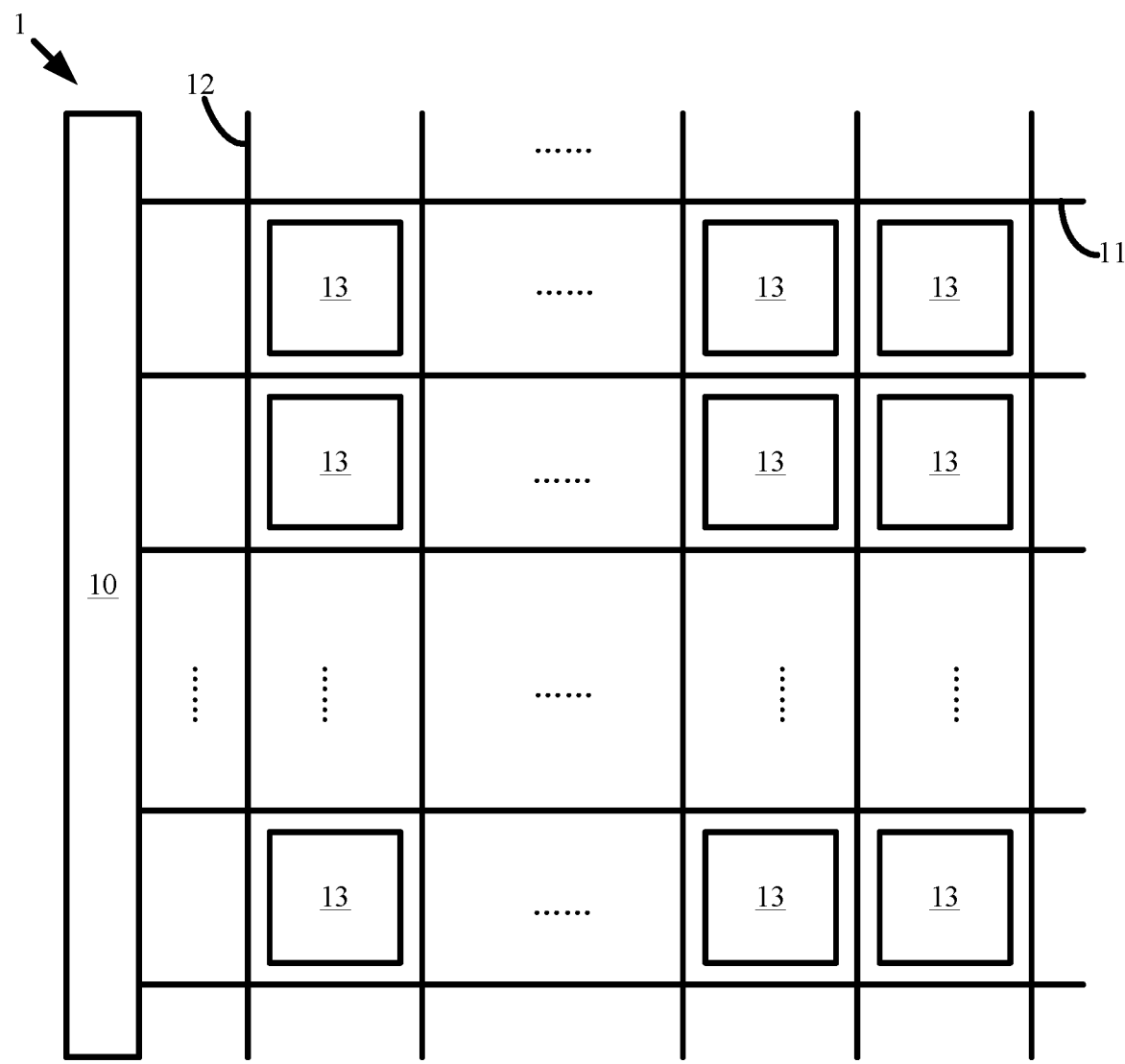
FIG. 9 is a schematic diagram of a display panel provided by embodiments of the present disclosure.

As shown in FIG. 9, the embodiment of the present disclosure further provides a display panel 1, and the display panel 1 includes the gate drive circuit 10 provided by any of the embodiments of the present disclosure.

For example, as shown in FIG. 9, the display panel 1 provided by the embodiment of the present disclosure further includes a plurality of gate lines 11, a plurality of data lines 12 and a plurality of pixel units 13 defined by the intersection of the gate lines 11 and the data lines 12. The gate drive circuit 10 is configured to provide a gate driving signal (that is, a scanning signal) to each of the gate lines 11. For example, the gate lines 11 can include the gate lines Gate(1), Gate(2) . . . Gate(n), Gate(n+1) . . . Gate(N) as shown in FIG. 8, and each shift register of the shift registers SR(1), SR(2) . . . SR(n), SR(n+1) . . . SR(N) is used to output the gate driving signal to the corresponding gate lines Gate(1), Gate(2) . . . Gate(n), Gate(n+1) . . . Gate(N).

Figure 10:
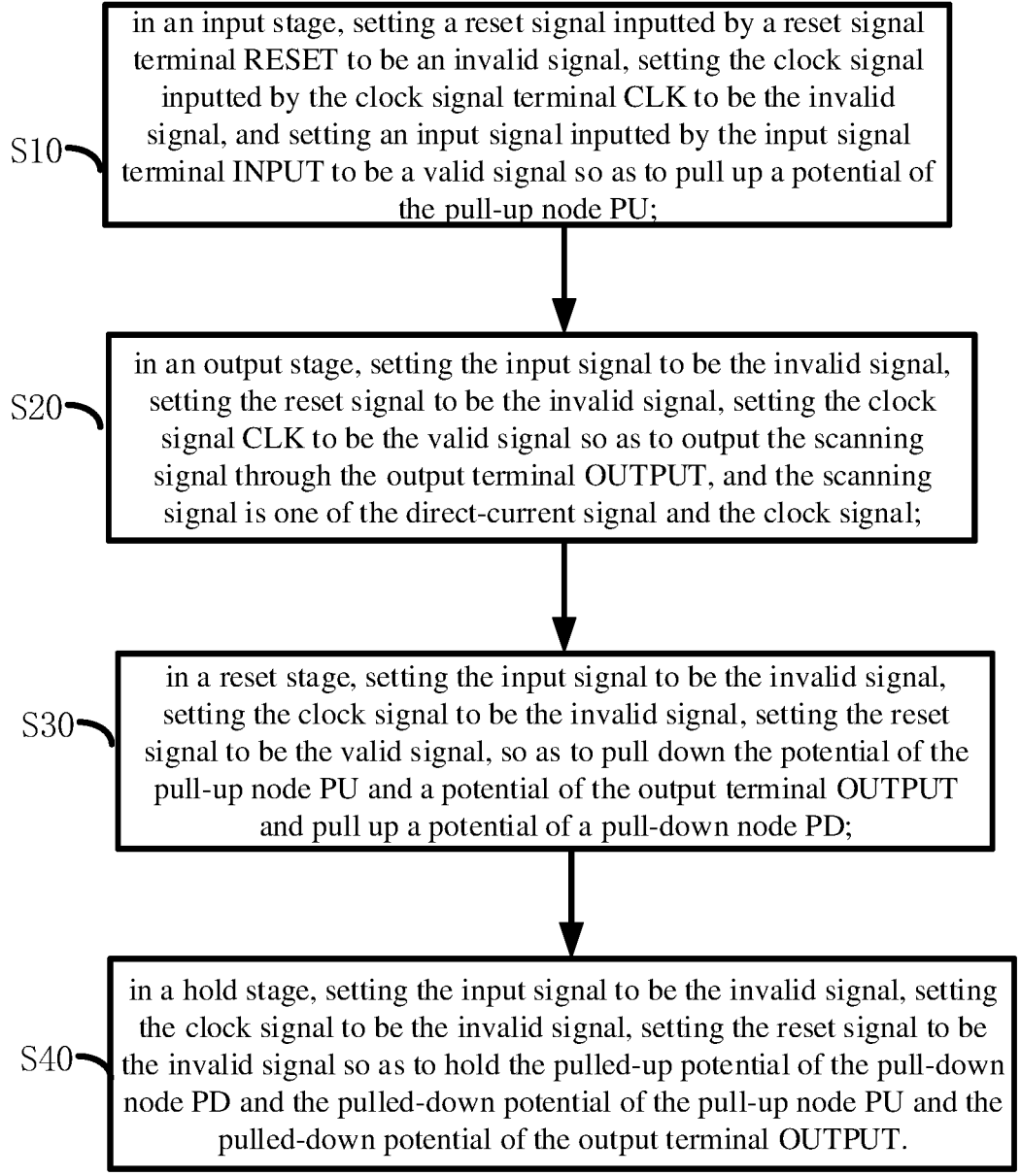
FIG. 10 is a flowchart of a driving method of a shift register provided by embodiments of the present disclosure.

As shown in FIG. 10, the embodiments of the present disclosure further provide a driving method of the shift register 100 according to any of the embodiments of the present disclosure. The driving method of the shift register can include: step S10, in an input stage, setting a reset signal inputted by a reset signal terminal RESET to be an invalid signal, setting the clock signal inputted by the clock signal terminal CLK to be the invalid signal, and setting an input signal inputted by the input signal terminal INPUT to be a valid signal so as to pull up a potential of the pull-up node PU; step S20, in an output stage, setting the input signal to be the invalid signal, setting the reset signal to be the invalid signal, setting the clock signal CLK to be the valid signal so as to output the scanning signal through the output terminal OUTPUT, and the scanning signal is one of the direct-current signal and the clock signal; step S30, in a reset stage, setting the input signal to be the invalid signal, setting the clock signal to be the invalid signal, setting the reset signal to be the valid signal, so as to pull down the potential of the pull-up node PU and a potential of the output terminal OUTPUT and pull up a potential of a pull-down node PD; and step S40, in a hold stage, setting the input signal to be the invalid signal, setting the clock signal to be the invalid signal, setting the reset signal to be the invalid signal so as to hold the pulled-up potential of the pull-down node PD and the pulled-down potential of the pull-up node PU and the pulled-down potential of the output terminal OUTPUT.

For example, for an n-type transistor, the valid signal is a high voltage signal and the invalid signal is a low voltage signal. For a p-type transistor, the valid signal is a low voltage signal and the invalid signal is a high voltage signal.

In some embodiments (for example, with reference to FIGS. 3-5), the shift register, the gate drive circuit, the display panel and the driving method provided by the embodiments of the present disclosure allows that, for the display region, the direct-current signal is adopted to drive the gate electrode of the switching transistor in the display region, compared to driving the gate electrode with the clock signal CLK, the dynamic power consumption can be reduced. In some embodiments (for example, with reference to FIGS. 3-5), the shift register, the gate drive circuit, the display panel and the driving method provided by the embodiments of the present disclosure can avoid the influence of the storage capacitor C1 on the scanning output signal (a load thereof), thereby improving display quality.

It should be noted that in the description of the embodiments of the present disclosure, each node (for example, the pull-up node PU, the pull-down node PD, the output control node A, the output control node G_N, the output control node P2 and the like) represents a meeting point of the related circuits connection in the circuit structural diagrams. Each node is the intersection of the related circuits connection, and each node is an equipotential point between the related circuits connection.

Although the present disclosure has been described in detail with reference to general descriptions and specific implementations, it will be apparent to those skilled in the art that modifications or improvements can be made thereto based on the embodiments of the present disclosure. Therefore, such modifications or improvements made without departing from the spirit of the present disclosure are intended to fall within the scope of the present disclosure.

The present application claims the priority of Chinese patent application No. 201710755253.3, filed on Aug. 29, 2017, and the entire content disclosed by the Chinese patent application is incorporated herein by reference as part of the present application.

What is claimed is:

1. A shift register, comprising:
    an input circuit, connected with a pull-up node and an input signal terminal;
    an output circuit, connected with the pull-up node, a clock signal terminal, a direct-current signal terminal, and an output terminal, wherein the clock signal terminal provides a clock signal, the direct-current signal terminal provides a direct-current signal, the output circuit outputs a scanning signal through the output terminal, and the scanning signal is one selected from the group consisting of the direct-current signal and the clock signal; and
    an output pull-down circuit, connected with the output circuit, wherein the output pull-down circuit is configured to pull down the scanning signal,
    the output circuit comprises a storage capacitor, a first output transistor, and a second output transistor,
    a first electrode of the first output transistor and a first electrode of the second output transistor are respectively connected with different terminals of the group consisting of the direct-current signal terminal and the clock signal terminal, and
    a second electrode of the first output transistor is connected with a control electrode of the second output transistor.

2. The shift register according to claim 1, wherein when the second output transistor is turned on, the output terminal is coupled to the direct-current signal terminal through the second output transistor;
    the first electrode of the first output transistor is connected with the clock signal terminal, a control electrode of the first output transistor is connected with the pull-up node, a first terminal of the storage capacitor is connected with the pull-up node, and a second terminal of the storage capacitor is connected with the second electrode of the first output transistor; and
    the first electrode of the second output transistor is connected with the direct-current signal terminal, and a second electrode of the second output transistor is connected with the output terminal.

3. The shift register according to claim 2, further comprising a pull-down control circuit, wherein the pull-down control circuit comprises a first control transistor, a second control transistor, a third control transistor, and a fourth control transistor;
    a first electrode of the first control transistor is configured to be connected with a second voltage terminal, and a second electrode of the first control transistor is connected with a pull-down node;
    a first electrode of the second control transistor is connected with the pull-down node, a control electrode of the second control transistor is connected with the pull-up node, and a second electrode of the second control transistor is configured to be connected with a first voltage terminal;
    a first electrode of the third control transistor is configured to be connected with the second voltage terminal, a control electrode of the third control transistor is configured to be connected with the second voltage terminal, and a second electrode of the third control transistor is connected with a control electrode of the first control transistor; and
    a first electrode of the fourth control transistor is connected with the second electrode of the third control transistor, a control electrode of the fourth control transistor is connected with the pull-up node, and a second electrode of the fourth control transistor is configured to be connected with the first voltage terminal.

4. The shift register according to claim 3, wherein the output pull-down circuit comprises a first output pull-down transistor and a second output pull-down transistor;
    a first electrode of the first output pull-down transistor is connected with the second electrode of the first output transistor, a control electrode of the first output pull-down transistor is connected with the pull-down node, and a second electrode of the first output pull-down transistor is configured to be connected with the first voltage terminal; and a first electrode of the second output pull-down transistor is connected with the output terminal, a control electrode of the second output pull-down transistor is connected with the pull-down node, and a second electrode of the second output pull-down transistor is configured to be connected with the first voltage terminal.

5. The shift register according to claim 4, wherein when the second output pull-down transistor is turned on, the output terminal is coupled to the first voltage terminal through the second output pull-down transistor.

6. The shift register according to claim 4, further comprising a reset circuit, wherein the reset circuit is connected with the pull-up node, a reset signal terminal, and a third voltage terminal, and
wherein the reset circuit is configured to receive a third voltage signal from the third voltage terminal so as to reset the output circuit, in a case where a reset condition is satisfied.

7. The shift register according to claim 6, wherein the reset circuit comprises a reset transistor; and
a control electrode of the reset transistor is connected with the reset signal terminal, a first electrode of the reset transistor is connected with the pull-up node, and a second electrode of the reset transistor is connected with the third voltage terminal.

8. The shift register according to claim 7, further comprising a pull-down hold circuit, wherein the pull-down hold circuit is configured to pull down a potential of the pull-up node in a case where a pull-down condition of the pull-up node is satisfied.

9. The shift register according to claim 8, wherein the pull-down hold circuit comprises a pull-down hold transistor; and
a control electrode of the pull-down hold transistor is connected with the pull-down node, a first electrode of the pull-down hold transistor is connected with the pull-up node, and a second electrode of the pull-down hold transistor is configured to be connected with the first voltage terminal.

10. The shift register according to claim 1, wherein
when the second output transistor is turned on, the output terminal is coupled to the clock signal terminal through the second output transistor;
the first electrode of the first output transistor is connected with the direct-current signal terminal, a control electrode of the first output transistor is connected with the pull-up node, a first terminal of the storage capacitor is connected with the pull-up node, and a second terminal of the storage capacitor is connected with the second electrode of the first output transistor; and
the first electrode of the second output transistor is connected with the clock signal terminal, and a second electrode of the second output transistor is connected with the output terminal.

11. The shift register according to claim 10, further comprising a pull-down control circuit, wherein the pull-down control circuit comprises a first control transistor and a second control transistor;
a first electrode of the first control transistor is configured to be connected with a second voltage terminal, a control electrode of the first control transistor is configured to be connected with the second voltage terminal, and a second electrode of the first control transistor is connected with a pull-down node; and
a first electrode of the second control transistor is connected with the pull-down node, a second electrode of the second control transistor is configured to be connected with a first voltage terminal, and a control electrode of the second control transistor is connected with the pull-up node.

12. The shift register according to claim 11, wherein the output pull-down circuit comprises a first output pull-down transistor and a second output pull-down transistor;
a first electrode of the first output pull-down transistor is connected with the second electrode of the first output transistor, a control electrode of the first output pull-down transistor is connected with the pull-down node, and a second electrode of the first output pull-down transistor is configured to be connected with the first voltage terminal; and
a first electrode of the second output pull-down transistor is connected with the output terminal, a control electrode of the second output pull-down transistor is connected with the pull-down node, and a second electrode of the second output pull-down transistor is configured to be connected with the first voltage terminal.

13. The shift register according to claim 12, wherein when the second output pull-down transistor is turned on, the output terminal is coupled to the first voltage terminal through the second output pull-down transistor.

14. The shift register according to claim 12, further comprising a reset circuit, wherein the reset circuit is connected with the pull-up node, a reset signal terminal, and a third voltage terminal, and
wherein the reset circuit is configured to receive a third voltage signal from the third voltage terminal so as to reset the output circuit, in a case where a reset condition is satisfied.

15. The shift register according to claim 14, wherein the reset circuit comprises a reset transistor; and
a control electrode of the reset transistor is connected with the reset signal terminal, a first electrode of the reset transistor is connected with the pull-up node, and a second electrode of the reset transistor is connected with the third voltage terminal.

16. The shift register according to claim 15, further comprising a pull-down hold circuit, wherein the pull-down hold circuit is configured to pull down a potential of the pull-up node in a case where a pull-down condition of the pull-up node is satisfied.

17. A gate drive circuit, comprising a plurality of cascaded shift registers each of which is according to claim 1,
wherein except for a first-stage shift register and a last-stage shift register, an input signal terminal of a shift register of present stage is connected with an output terminal of a shift register of a preceding stage; and
a reset signal terminal of the shift register of present stage is connected with an output terminal of a shift register of a next stage.

18. A display panel, comprising the gate drive circuit according to claim 17.

19. A driving method of the shift register according to claim 1, comprising:
in an input stage, setting a reset signal inputted by a reset signal terminal to be an invalid signal, setting the clock signal inputted by the clock signal terminal to be the invalid signal, and setting an input signal inputted by the input signal terminal to be a valid signal so as to pull up a potential of the pull-up node;
in an output stage, setting the input signal to be the invalid signal, setting the reset signal to be the invalid signal, setting the clock signal to be the valid signal so as to output the scanning signal through the output terminal, wherein the scanning signal is one selected from the group consisting of the direct-current signal and the clock signal;

in a reset stage, setting the input signal to be the invalid signal, setting the clock signal to be the invalid signal, setting the reset signal to be the valid signal, so as to pull down the potential of the pull-up node and a potential of the output terminal, and pull up a potential of a pull-down node; and in a hold stage, setting the input signal to be the invalid signal, setting the clock signal to be the invalid signal, setting the reset signal to be the invalid signal so as to hold the potential of the pull-down node that is pulled up and the potential of the pull-up node that is pulled-down and the potential of the output terminal that is pulled down.

20. The driving method according to claim 19, wherein the valid signal is a high-voltage signal, and the invalid signal is a low-voltage signal.

\* \* \* \* \*